(12) United States Patent
Seok

(10) Patent No.: US 10,424,677 B2
(45) Date of Patent: Sep. 24, 2019

(54) CHARGE CARRIER EXTRACTION INVERSE DIODE

(71) Applicant: Littelfuse, Inc., Chicago, IL (US)

(72) Inventor: Kyoung Wook Seok, Milpitas, CA (US)

(73) Assignee: Littelfuse, Inc., Chicago, IL (US)

( * ) Notice: Subject to any disclaimer, the term of this patent is extended or adjusted under 35 U.S.C. 154(b) by 26 days.

(21) Appl. No.: 15/693,392

(22) Filed: Aug. 31, 2017

(65) Prior Publication Data

US 2019/0067493 A1    Feb. 28, 2019

(51) Int. Cl.
*H01L 29/861*    (2006.01)
*H01L 29/66*    (2006.01)
(Continued)

(52) U.S. Cl.
CPC ...... *H01L 29/8611* (2013.01); *H01L 29/0603* (2013.01); *H01L 29/0619* (2013.01);
(Continued)

(58) Field of Classification Search
CPC ..... H01L 21/761; H01L 21/76; H01L 21/223; H01L 21/763; H01L 21/76237; H01L 29/745; H01L 29/7395; H01L 29/0638; H01L 29/0834; H01L 29/0646; H01L 29/74; H01L 21/768; H01L 2224/056;
(Continued)

(56) References Cited

U.S. PATENT DOCUMENTS 4,351,677 A    9/1982 Mochizuki et al. .......... 148/188
5,142,347 A    8/1992 Voss
(Continued)

FOREIGN PATENT DOCUMENTS

EP    0361316    9/1988
EP    0361320    9/1988
(Continued)

OTHER PUBLICATIONS

Biermann et al., "New 3300V High Power Emcon-HDR Diode with High Dynamic Robustness," eupec GmbH and Infineon Technologies, Warstein, Germany 2009 (5 pages).
(Continued)

*Primary Examiner* — Sonya D. McCall-Shepard

(57) ABSTRACT

An inverse diode die is "fast" (i.e., has a small peak reverse recovery current) due to the presence of a novel topside P+ type charge carrier extraction region and a lightly-doped bottomside transparent anode. During forward conduction, the number of charge carriers in the N− type drift region is reduced due to holes being continuously extracted by an electric field set up by the P+ type charge carrier extraction region. Electrons are extracted by the transparent anode. When the voltage across the device is then reversed, the magnitude of the peak reverse recovery current is reduced due to there being a smaller number of charge carriers that need to be removed before the diode can begin reverse blocking mode operation. Advantageously, the diode is fast without having to include lifetime killers or otherwise introduce recombination centers. The inverse diode therefore has a desirably small reverse leakage current.

20 Claims, 14 Drawing Sheets

FAST RECOVERY INVERSE DIODE

(51) Int. Cl.
   *H01L 29/06* (2006.01)
   *H01L 29/40* (2006.01)
   *H01L 23/31* (2006.01)

(52) U.S. Cl.
   CPC ...... *H01L 29/402* (2013.01); *H01L 29/66098* (2013.01); *H01L 29/66136* (2013.01); *H01L 29/861* (2013.01); *H01L 23/3171* (2013.01)

(58) Field of Classification Search
   CPC ..... H01L 24/05; H01L 29/407; H01L 29/063; H01L 29/0623; H01L 29/0615; H01L 29/8611; H01L 29/0619; H01L 29/872; H01L 29/404; H01L 29/66136; H01L 29/0603; H01L 29/861; H01L 29/66098; H01L 29/402; H01L 23/3171
   See application file for complete search history.

(56) References Cited

U.S. PATENT DOCUMENTS

| | | | |
|---|---|---|---|
| 5,698,454 A | 12/1997 | Zommer | 437/6 |
| 6,507,050 B1 | 1/2003 | Green | 257/170 |
| 6,936,908 B2 | 8/2005 | Kelberlau et al. | 257/502 |
| 7,030,426 B2 | 4/2006 | Neidig | 257/170 |
| 7,442,630 B2 | 10/2008 | Kelberlau et al. | 438/510 |
| 8,093,652 B2 | 1/2012 | Veeramma et al. | 257/329 |
| 8,716,067 B2 | 5/2014 | Wisotzki et al. | 438/113 |
| 8,716,745 B2 | 5/2014 | Veeramma | 257/109 |
| 9,590,033 B1 | 3/2017 | Wisotzki et al. | |
| 9,741,570 B1 * | 8/2017 | Dainese | H01L 21/2255 |
| 2015/0061090 A1 | 3/2015 | Oyama | |
| 2016/0027866 A1 | 1/2016 | Yoshikawa | |

FOREIGN PATENT DOCUMENTS

| | | |
|---|---|---|
| EP | 0364760 | 9/1988 |
| JP | H1093113 A | 4/1998 |
| JP | 2014011213 A | 1/2014 |

OTHER PUBLICATIONS

Data sheet for DWN 17-18 Diode Chip, IXYS Corporation Dec. 15, 2015 (2 pages).
Lutz et al., "Semiconductor Power Devices—Physics, Characteristics, Reliability," Springer-Verlag Berlin Heidelberg 2011, ISBN 978-3-642-11124-2, Library of Congress Control No. 2010934110, pp. 146-147 (5 pages).
Data Sheet entitled, "FRED, Rectifier Diode and Thyristor Chips in Planar Design," IXYS Corporation 2004 (5 pages).
Extended European Search Report for the European Patent Application No. 18191735, dated Jan. 22, 2019.

* cited by examiner

FAST RECOVERY INVERSE DIODE

TOP-DOWN VIEW OF THE SEMICONDUCTOR SURFACE

| REGION | CONCENTRATION OR DOSE | DOPANT OR MATERIAL | THICKNESS OR DEPTH |
|---|---|---|---|
| P- TYPE BOTTOMSIDE REGION (TRANSPARENT ANODE) | 4E16 atoms/cm$^3$ | BORON | 3 microns thick |
| N- TYPE DRIFT REGION | 2E14 atoms/cm$^3$ | PHOSPHORUS | 28 microns thick |
| N TYPE DEPLETION STOP REGION | 3E16 atoms/cm$^3$ | | 1.6 microns thick |
| P TYPE PERIPHERAL SIDEWALL REGION | 1E18 - 5E19 atoms/cm$^3$ | ALUMINUM | 220 microns deep 145 microns wide at top |
| P+ TYPE CHARGE CARRIER EXTRACTOR REGION | 5E19 atoms/cm$^3$ | BORON | 0.4 micron thick |
| P+ TYPE FLOATING FIELD RING | 5E19 atoms/cm$^3$ | BORON | 0.6 micron thick |
| N+ TYPE CATHODE CONTACT REGION | 5E19 atoms/cm$^3$ | PHOSPHORUS | 0.5 micron thick |
| METAL CATHODE ELECTRODE | | ALUMINUM | 4 microns thick |
| METAL ANODE ELECTRODE | | Ti-Ni-Ag | 1 micron thick |
| TOPSIDE PASSIVATION LAYER | | SILICON NITRIDE AND/ OR POLYIMIDE | 0.6 microns thick |

FAST RECOVERY INVERSE DIODE
(REVERSE BREAKDOWN VOLTAGE RATING = 550 VOLTS)

FIG. 3

(FORWARD BIAS - FORWARD CURRENT)

HOLES EXTRACTED THROUGH P+ TYPE CHARGE EXTRACTION REGION
CORRESPONDING ELECTRONS EXPELLED DUE TO CHARGE NEUTRALITY
(FORWARD BIAS - FORWARD CURRENT)

ELECTRONS RECOMBINE BEFORE REACHING THE METAL

ELECTRON CONCENTRATION IN THE STRUCTURE OF FIG. 6

ELECTRONS PASS ALL THE WAY TO THE METAL

ELECTRON CONCENTRATION IN THE STRUCTURE OF FIG. 8

(SWITCH TO REVERSE BIAS - REVERSE RECOVERY CURRENT)

ELECTRONS PASS THROUGH N+ CONTACT REGION
(SWITCH TO REVERSE BIAS - REVERSE RECOVERY CURRENT)

|  | DEVICE A (FIG. 1, WITH LIFETIME CONTROL BUT WITHOUT TRANSPARENT ANODE OR CHARGE EXTRACTION) | DEVICE B (FIG. 1) |
| --- | --- | --- |
| DEVICE SIZE ($cm^2$) | 0.05 $cm^2$ | 0.05 $cm^2$ |
| FORWARD VOLTAGE DROP ($V_f$) | 0.908 volts | 1.109 volts |
| FORWARD CURRENT ($I_f$) | 10 amperes | 10 amperes |
| REVERSE VOLTAGE ($V_r$) | 100 volts | 100 volts |
| TIME BETWEEN ZERO CROSSINGS ($T_{zz}$) | 46.9 nanoseconds | 58.4 nanoseconds |
| PEAK REVERSE RECOVERY CURENT ($I_{rr}$) | -3.89 amperes | -3.90 amperes |
| REVERSE BRAKDOWN VOLTAGE ($V_{br}$) | 632.6 volts | 632.4 volts |
| MAX Di/dt OF $I_{rr}$ (A/us) | 100 amperes/microsec. | 100 amperes/microsec. |
| REVERSE LEAKAGE CURRENT ($I_{lk}$) @450V | 666 microamperes | 2.04 microamperes |

RESULTS OF COMPARATIVE SIMULATIONS
(REVERSE BREAKDOWN VOLTAGE RATING = 550 VOLTS)

FIG. 12

CROSS-SECTIONAL SIDE VIEW OF A THINNNED WAFER

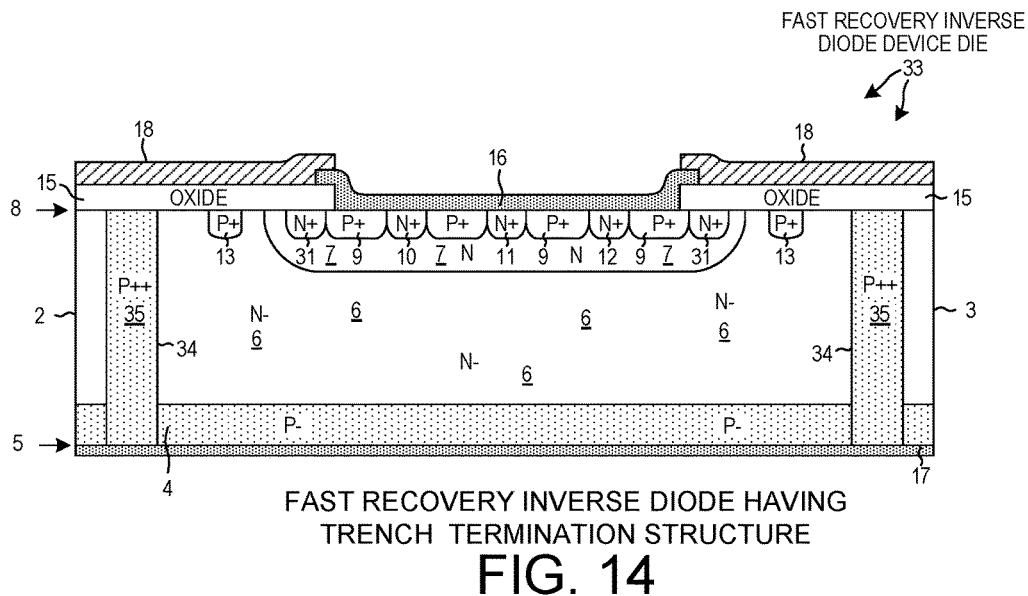

FAST RECOVERY INVERSE DIODE HAVING
TRENCH TERMINATION STRUCTURE

FIG. 14

| REGION | CONCENTRATION OR DOSE | DOPANT OR MATERIAL | THICKNESS OR DEPTH |
|---|---|---|---|
| P- TYPE BOTTOMSIDE REGION (TRANSPARENT ANODE) | 3E16 atoms/cm³ | BORON | 3 microns thick |
| N- TYPE DRIFT REGION | 5E16 atoms/cm³ | PHOSPHORUS | 65 microns thick |
| N TYPE DEPLETION STOP REGION | 4E16 atoms/cm³ | | 1.6 microns thick |
| P TYPE PERIPHERAL SIDEWALL REGION | 1E18 - 5E19 atoms/cm³ | ALUMINUM | 80 microns deep 100 microns wide at top |
| P+ TYPE CHARGE CARRIER EXTRACTOR REGION | 5E19 atoms/cm³ | BORON | 0.4 micron thick |
| P+ TYPE FLOATING FIELD RING | 5E19 atoms/cm³ | BORON | 0.5 micron thick |
| N+ TYPE CATHODE CONTACT REGION | 5E19 atoms/cm³ | PHOSPHORUS | 0.4 micron thick |
| METAL CATHODE ELECTRODE | | ALUMINUM | 4 microns thick |
| METAL ANODE ELECTRODE | | Ti-Ni-Ag | 1 micron thick |
| TOPSIDE PASSIVATION LAYER | | SILICON NITRIDE AND/ OR POLYIMIDE | 0.7 microns thick |

(REVERSE BREAKDOWN VOLTAGE RATING = 1200 VOLTS)

FIG. 17

| | DEVICE C (FIG. 1, WITH LIFETIME CONTROL BUT WITHOUT TRANSPARENT ANODE OR CHARGE EXTRACTION) | DEVICE D (FIG. 1) |
|---|---|---|
| DEVICE SIZE ($cm^2$) | 0.05 $cm^2$ | 0.05 $cm^2$ |
| FORWARD VOLTAGE DROP ($V_f$) | 1.90 volts | 1.57 volts |
| FORWARD CURRENT ($I_f$) | 10 amperes | 10 amperes |
| REVERSE VOLTAGE ($V_r$) | 100 volts | 100 volts |
| TIME BETWEEN ZERO CROSSINGS ($T_{zz}$) | 87 nanoseconds | 117 nanoseconds |
| PEAK REVERSE RECOVERY CURENT ($I_{rr}$) | -4.94 amperes | -4.94 amperes |
| REVERSE BRAKDOWN VOLTAGE ($V_{br}$) | 1348 volts | 1348 volts |
| MAX Di/dt OF $I_{rr}$ (A/us) | | |
| REVERSE LEAKAGE CURRENT ($I_{lk}$) @450V | 878 microamperes | 1.24 microamperes |

RESULTS OF COMPARATIVE SIMULATIONS
(REVERSE BREAKDOWN VOLTAGE RATING = 1200 VOLTS)

FIG. 18

CHARGE CARRIER EXTRACTION INVERSE DIODE

TECHNICAL FIELD

The described embodiments relate to inverse diode devices and to related methods.

BACKGROUND INFORMATION

Most all types of commercially-available power diodes that have high reverse breakdown voltage capabilities also have N– type bottomside cathodes. A rare exception is the so-called "inverse diode" or "reverse diode" that is commercially available from IXYS Corporation, 1590 Buckeye Drive, Milpitas, Calif. These unusual diodes have P type isolation structures involving a bottomside P type anode region as well as P type peripheral sidewall diffusion regions. These unusual diodes have a few superior characteristics as compared to other types of diodes. For example, they may have high reverse breakdown voltages while simultaneously exhibiting superior dynamic robustness. Ways of extending this inverse diode architecture into new areas of application are sought.

SUMMARY

A novel inverse diode device die has a lightly-doped bottomside P– type silicon region. This bottomside region has such a P type dopant concentration and has such a thickness that it functions as what is called a "transparent anode". A central active area of the inverse diode device die is separated from the peripheral side edges of the die by a P type silicon peripheral sidewall region. The P type silicon peripheral sidewall region and the bottomside P– type silicon region together form a P type isolation structure. P type silicon of this P type isolation structure fully surrounds the N– type silicon in the central active area of the die from the side as well as underneath from the bottom. In a preferred embodiment, the inverse diode device die involves no epitaxial silicon but rather all silicon regions are regions of float zone bulk silicon wafer material. In one example, the lightly-doped bottomside P– type silicon region is a "transparent anode" region in that: 1) it has a thickness of less than ten microns, 2) it has a light P type dopant concentration of less than $3 \times 10^{17}$ atoms/cm$^3$, and 3) it allows electrons to pass, during forward conduction of the inverse diode device die, from the N– type silicon region, downward across the lightly-doped bottomside P– type silicon region, and to the bottomside anode metal electrode without the electrons recombining. The $3 \times 10^{17}$ atoms/cm$^3$ P type dopant concentration is measured at the bottom semiconductor surface adjacent where the bottomside P– type silicon region adjoins the bottomside anode metal electrode.

The novel inverse diode device die is "fast" (i.e., has a small peak reverse recovery current ($I_{rr}$)) due the presence of a novel "P+ type charge carrier extraction region" and due to the transparent anode. During forward conduction of the inverse diode device die, holes are continuously extracted by an electric field set up by the novel P+ type charge carrier extraction region. The holes pass upward through the P+ type charge carrier extraction region toward the topside cathode metal electrode. In addition, electrons are extracted from the N– type drift region. These extracted electrons pass downward all the way through the lightly-doped bottomside P– type silicon region and to the underlying anode metal electrode without recombining in the bottomside P– type silicon region. Due to these two mechanisms, the concentration of charge carriers (both holes and electrons) in the N– type drift region of the diode during forward conduction is reduced.

When the voltage across the inverse diode device die is then switched to a reverse bias voltage, the magnitude of the peak reverse recovery current ($I_{rr(peak)}$) is reduced due to there being a smaller number of charge carriers that need to be removed before the diode can begin reverse blocking mode operation. Advantageously, the inverse diode device die is fast without having to involve lifetime killers, charge trapping ions or atoms, added silicon crystal defects, and/or other recombination center structures. The inverse diode device die has the desirable characteristic of simultaneously having all of the following: 1) a low forward voltage drop ($V_f$) in a high current forward conduction condition, 2) a small peak reverse recovery current ($I_{rr}$) when switching from the high current forward current condition to a reverse voltage condition, 3) a high reverse breakdown voltage ($V_{br}$) withstand capability, and 4) a small reverse leakage current ($I_{lk}$) in a high voltage static reverse blocking condition. The small reverse leakage current is especially important under high junction temperatures.

In one specific example, wafer thinning is employed such that the thickness of the central N– type drift region is less than 50 microns and more than 25 microns (in one example it is 28 microns thick). This distance is measured along a line normal to the plane of the bottom semiconductor surface, extending along that line from the top of the bottomside P– type region to the bottom of the N type depletion stepper region. The use of wafer thinning allows the advantages of the novel P+ type charge carrier extraction region and the transparent anode to be applied to certain applications where extremely high reverse breakdown voltage capabilities are not required, but where a fast diode having both a low forward voltage drop $V_f$ and a small peak reverse recovery current $I_{rr}$ are desired. The wafer thinning employed may be conventional backside grinding or TAIKO process backside grinding.

In another embodiment, a novel inverse diode device die has a P type isolation structure fully that surrounds an N– type silicon region in the central active area of the die. The inverse diode device die has a novel "P+ type charge carrier extraction region" at its topside, but the bottomside P type silicon region of the inverse diode device is not a transparent anode.

In another novel aspect, a semiconductor device manufacturing process is disclosed in which a fast recovery inverse diode is made. The fast recovery inverse diode has the novel P+ type charge carrier extraction region as well as a bottomside transparent anode. In the manufacturing method, topside processing is performed on a wafer in order to form the topside silicon regions. The topside metal electrodes are also formed on the wafer. The wafer is then thinned from the bottomside. After bottomside thinning, the P– type bottomside regions (the transparent anode region) are formed. After bottomside metallization, the wafer is singulated into a plurality of identical fast recovery inverse diodes.

In yet another novel aspect, a semiconductor device manufacturing process is disclosed in which a fast recovery inverse diode is made. The fast recovery inverse diode has the novel P+ type charge carrier extraction region as well as a bottomside transparent anode. In the method, a wafer is thinned from the bottomside (for example, by ordinary backside grinding or by TAIKO process grinding) before topside processing. This allows the ground down bottomside silicon surface to be treated to reduce crystal defects introduced in the grinding of the thinning step. This treatment may involve a sacrificial oxidation of the ground down bottomside silicon surface. After this treatment, the transparent anodes are implanted from the bottomside. The formation of the topside regions is then performed. After topside and the bottomside metalization, the resulting wafer is singulated into a plurality of identical fast recovery inverse diodes. In cases in which the transparent anode layer is thin and in which crystal defects introduced by backside wafer thinning cause undesired increases in reverse leakage current, the ability to treat the ground down bottomside surface in order to prevent there being such defects at what will be the transparent anode PN junction is particularly advantageous.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 3 is a table that sets forth dopant concentrations, dopant types and dimensions of various parts of the fast recovery inverse diode device of FIG. 1.

FIG. 12 is a table that sets forth results of a comparative simulation.

FIG. 14 is a cross-sectional side view of a second embodiment of a fast recovery inverse diode device die.

FIG. 17 is a table that sets forth dopant concentrations, dopant types and dimensions of various parts of a novel fast recovery inverse diode device that has a reverse breakdown voltage rating of 1200 volts.

FIG. 18 is a table that sets forth results of a comparative simulation.

DETAILED DESCRIPTION

Reference will now be made in detail to background examples and some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "top", "topside", "up", "upward", "down", "downward", "vertically", "laterally", "side", "under", "backside", "bottom" and "bottomside" are used herein to describe relative orientations between different parts of the structure being described, and it is to be understood that the overall structure being described can actually be oriented in any way in three-dimensional space. When processing is described in the description below as being performed on the bottom of the wafer, such as for example when dopants are said to diffuse upward, it is understood the wafer may actually be oriented upside down during these processing steps, and may be processed from the top in ordinary fashion. In the description below, P type silicon can be generally referred to simply as P type silicon or it can be more specifically referred to as P++ type silicon, P+ type silicon, P type silicon, or P− type silicon. The P++, P+, P and P− designators are intended to designate relative ranges of dopant concentrations in a rough general sense. There may, for example, be an overlap in the ranges of concentrations between silicon described as P+ type silicon and silicon described as P type silicon. The dopant concentration at the bottom of the P+ type silicon range may be lower than the dopant concentration at the top of the P type silicon range. The same manner of describing N type silicon (in terms of sometimes more specifically referring to N+ type silicon, N type silicon, or N− type silicon) is also employed in this patent document.

Figure 1:
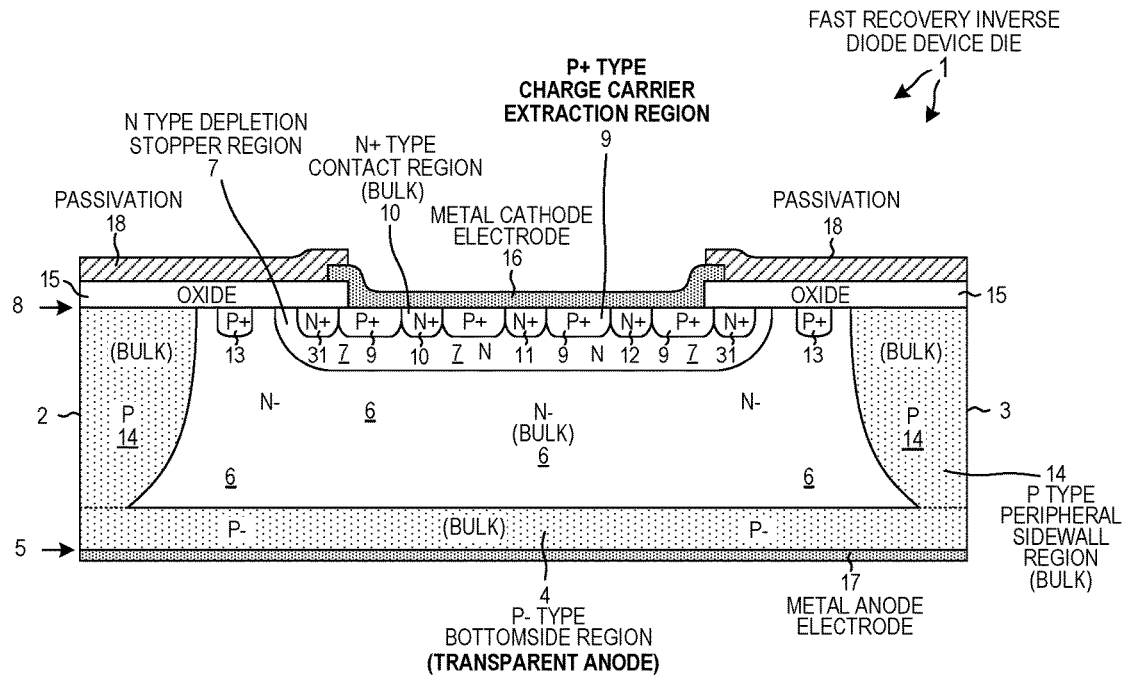
FIG. 1 is a cross-sectional side view diagram of a first embodiment of a fast recovery inverse diode device die 1 in accordance with one novel aspect.

FIG. 1 is a cross-sectional side view diagram of a first embodiment of a fast recovery inverse diode device die 1 in accordance with one novel aspect. The die 1 is a discrete diode device. The die 1 has a rectangular top surface, a rectangular bottom surface, and four peripheral side edges. Two of the side edges 2 and 3 are illustrated in the cross-sectional side view diagram. More particularly, a bottomside P− type silicon region 4 extends upward from the planar bottom semiconductor surface 5 of the die and also extends laterally outwardly to all four peripheral side edges of the die. In the cross-section of the diagram, the bottomside P− type silicon region 4 is pictured extending out to the peripheral side edges 2 and 3.

An N− type silicon region 6 is disposed over the bottomside P− type silicon region 4 as shown in FIG. 1. This N− type silicon region 6, which is also referred to as the N− drift region, in this particular example is of the same bulk wafer material as is the bottomside P− type silicon region 4. The N− type silicon region 6 is the cathode of the inverse diode 1 because the principal PN junction of the inverse diode 1 is the junction between the top of the bottomside P− type silicon region 4 and the bottom of the N− type silicon region 6.

An N type depletion stopper region 7 extends down from the top semiconductor surface 8 down into the N− type silicon region 6. A plurality of N+ type contact regions extend down from the top semiconductor surface 8 down into the N type depletion stopper region 7 as illustrated. There are three N+ type contact regions 10-12 in the particular cross-section illustrated in FIG. 1. There is also a ring-shaped N+ type depletion stopper region 31. A P+ type charge carrier extraction region 9 extends down from the top semiconductor surface 8 down into the N type depletion stopper region 6 as illustrated.

Figure 2:
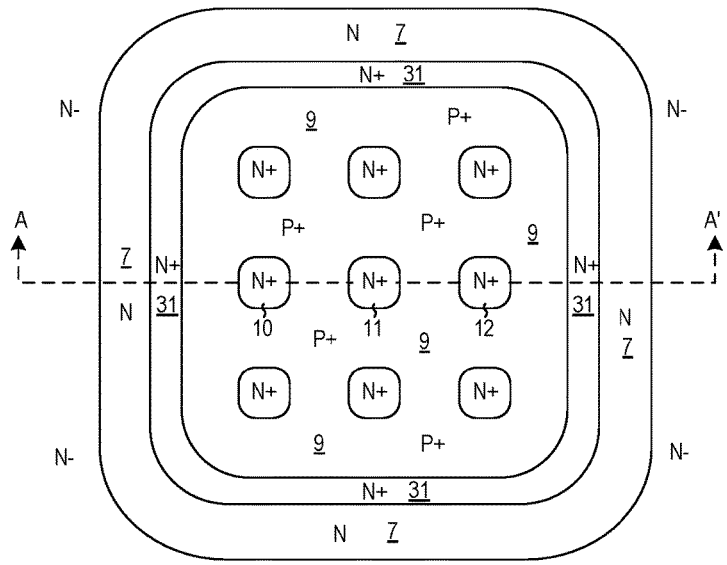
FIG. 2 is a top-down diagram of the P+ type charge carrier extraction region, the N+ type contact regions, the ring-shaped N+ type depletion region, and the N type depletion stopper region of the fast recovery inverse diode device die of FIG. 1.

FIG. 2 is a top-down diagram of the P+ type charge carrier extraction region 9 and the N+ type contact regions 10-12, the ring-shaped N+ type depletion stopper region 31, and the N type depletion stopper region 7. The top-down diagram of FIG. 2 is a view taken along the top semiconductor surface 8 of the die. The cross-sectional view of FIG. 1 is taken along the sectional line A-A' of FIG. 2. As can be seen from the top-down view of FIG. 2, the nine N+ type contact regions are disposed in a two-dimensional array of rows and columns. Each of the nine N+ type contact regions is laterally surrounded by P+ type silicon of the P+ type charge carrier extraction region 9. The ring-shaped N+ type depletion stopper region 31 extends around the outer periphery of the P+ type charge carrier extraction region 9.

The depth of the nine N+ type contact regions, the depth of the ring-shaped N+ type depletion stopper region 31, and the depth of the P+ type charge carrier extraction region 9 are similar. In this example these depths are in a range of about 0.4 microns to about 0.6 microns. The depth of the N type depletion stopper region 7 is about 1.6 microns, where this depth is measured from the top of the N− type region 6 to the bottom of the P+ type charge carrier extraction region 9. The N type depletion stopper region 7 is made adequately thicker than the P+ type charge carrier extraction region 9 so that under the desired maximum reverse blocking voltage of the device the principal depletion region (from the PN junction between regions 4 and 6) does not extend upward so far as to reach the depletion region at the PN junction between the bottom of the P+ type charge carrier extraction region 9 and N type silicon of the N type depletion stopper region 7.

A P+ type floating field ring 13 extends down from the top semiconductor surface 8 down into the N− type silicon region 6 as illustrated. P+ type floating field ring 13 peripherally rings around the central area of the die where the N type depletion stopper region 7 is located.

The die also has a P type silicon peripheral sidewall region 14 that extends laterally inwardly from the four peripheral side edges of the die such that it rings around the central N− type silicon region 6. The P type silicon peripheral sidewall region 14 extends down and joins the bottomside P− type silicon region 4 and also extends up to the top semiconductor surface 8. The combination of the P type peripheral region 14 and the bottomside P− type silicon region 4 form what is called the "P type isolation structure" (also sometimes called the "P type isolation region", or the "P type separation diffusion structure", or the "P type separation diffusion region"). P type silicon of this structure fully surrounds the N− type silicon region 6 both peripherally from the sides as well as underneath from the bottom. In one example, the P type separation diffusion structure is made by diffusing aluminum downward from the top semiconductor surface 8 so as to form region 14, and by ion implanting the bottom of the wafer with P type dopants and then activating the dopants by laser annealing to form the region 4.

For additional information on various suitable different P type separation diffusion structures and how to form them, see: 1) U.S. Pat. No. 7,442,630, entitled "Method For Fabricating Forward And Reverse Blocking Devices", filed Aug. 30, 2005, by Kelberlau et al.; 2) U.S. Pat. No. 5,698, 454, entitled "Method Of Making A Reverse Blocking IGBT", filed Jul. 31, 1995, by N. Zommer; 3) J. Lutz et al., "Semiconductor Power Devices", pages 146-147, published by Springer, Berlin and Heidelberg (2011); 4) the data sheet entitled "Diode Chip", DWN 17-18, by IXYS Corporation of Milpitas, Calif. 95035, USA; 5) U.S. Pat. No. 9,590,033, entitled "Trench Separation Diffusion For High Voltage Device", filed Nov. 20, 2005, by Wisotzki et al.; 6) U.S. Pat. No. 4,351,677, entitled "Method of Manufacturing Semiconductor Device Having Aluminum Diffused Semiconductor Substrate", filed Jul. 10, 1980, by Mochizuki et al.; 7) U.S. Pat. No. 6,507,050, entitled "Thyristors Having A Novel Arrangement of Concentric Perimeter Zones", filed Aug. 16, 2000, by Green; 8) U.S. Pat. No. 6,936,908, entitled "Forward and Reverse Blocking Devices", filed Mar. 13, 2002, by Kelberlau et al.; 9) U.S. Pat. No. 7,030, 426, entitled "Power Semiconductor Component in the Planar Technique", filed Mar. 14, 2005, by Neidig; 10) U.S. Pat. No. 8,093,652, entitled "Breakdown Voltage For Power Devices", filed Aug. 27, 2003, by Veeramma et al.; 11) the 2004 description entitled "FRED, Rectifier Diode and Thyristor Chips in Planar Design", by IXYS Semiconductor GmbH, Edisonstrasse 15, D-68623, Lampertheim, Germany; 12) U.S. Pat. No. 8,716,067, entitled "Power Device Manufacture On The Recessed Side Of A Thinned Wafer", filed Feb. 20, 2012, by Wisotzki et al.; U.S. Pat. No. 8,716,745, entitled "Stable Diodes For Low And High Frequency Applications", filed May 11, 2006, by Veeramma. The entire subject matter of each of the following documents is incorporated herein by reference: 1) U.S. Pat. No. 7,442, 630; 2) U.S. Pat. No. 5,698,454; 3) U.S. Pat. No. 9,590,033; 4) U.S. Pat. No. 4,351,677; 5) U.S. Pat. No. 6,507,050; 6) U.S. Pat. No. 6,936,908; 7) U.S. Pat. No. 7,030,426; 8) U.S. Pat. No. 8,093,652; 9) U.S. Pat. No. 8,716,067; 10) U.S. Pat. No. 8,716,745.

An oxide layer 15 is disposed directly on the top semiconductor surface 8 as shown. This oxide layer 15 laterally surrounds a cathode contact portion of the top semiconductor surface 8. A topside metal electrode 16 is disposed directly on the cathode contact portion of the top semiconductor surface 8 as illustrated. This topside metal electrode 16 is a cathode electrode or a cathode terminal of the diode device. A bottomside metal electrode 17 is disposed directly on the bottom semiconductor surface 5 of the die. This bottomside metal electrode 17 extends all across the bottom semiconductor surface 5 from the die edge 2 to the die edge 3. Bottomside metal electrode 17 as well as the bottomside P− type region 4 are much wider than the topside metal electrode 16. Bottomside metal electrode 17 is an anode electrode or an anode terminal of the diode device 1. A topside passivation layer 18 is disposed over the oxide layer 15 so that passivation overlaps and covers the peripheral edges of the topside metal electrode 16. In this die structure, all silicon regions between the bottom semiconductor surface 5 and the top semiconductor surface 8 are bulk silicon wafer material. There is no epitaxial silicon material.

After wafer fabrication, the wafer is diced. The resulting dice may be used as bare dice, or they may be packaged into three terminal semiconductor device packages.

FIG. 3 is a table that sets forth dopant concentrations, dopant types and dimensions of various parts of the fast recovery inverse diode device 1 of FIG. 1.

Figure 4:
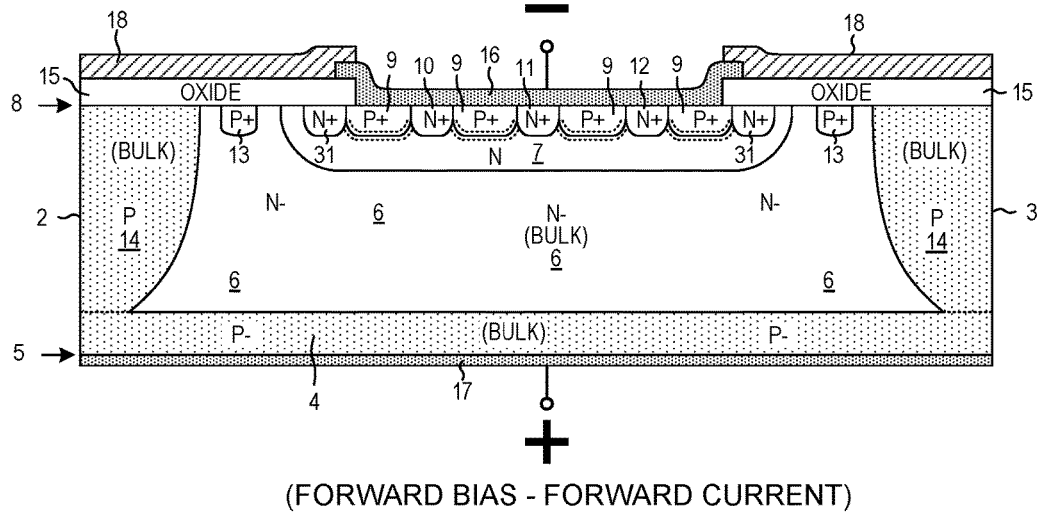
FIG. 4 is a cross-sectional diagram that illustrates an operation of the novel fast recovery inverse diode device of FIG. 1 in a forward bias situation.
Figure 5:
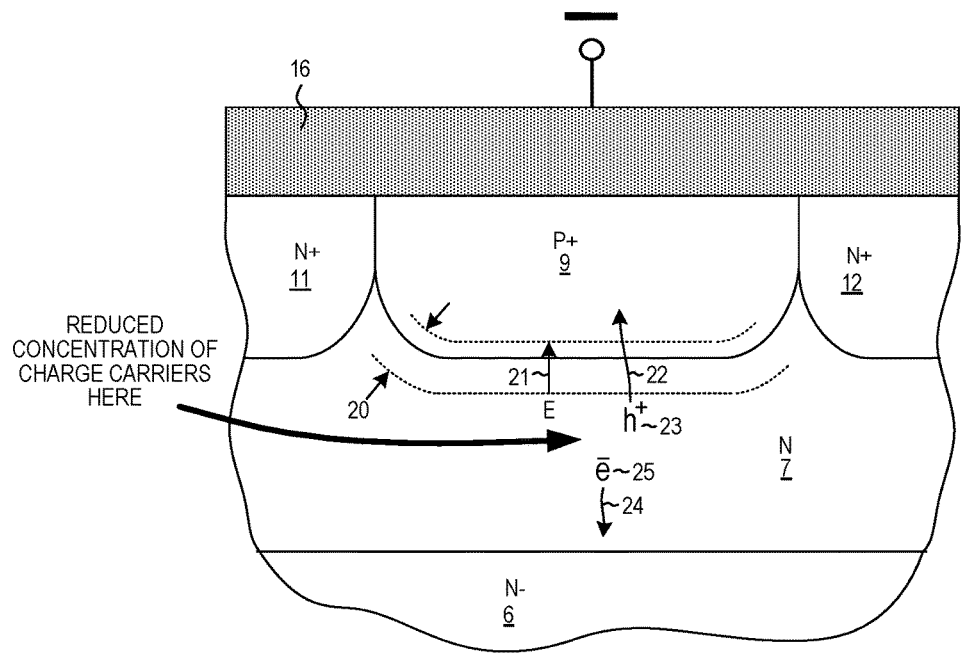
FIG. 5 shows a portion of the inverse diode device 1 of FIG. 4 in an enlarged fashion.

FIG. 4 is a cross-sectional diagram that illustrates an operation of the novel fast recovery inverse diode device die of FIG. 1 in a forward bias situation. FIG. 5 shows a portion of the die of FIG. 4 in an enlarged fashion. In the forward bias condition, current flows from the anode electrode 17 on the bottom, up through the device, and out of the cathode electrode 16 on the top. During this time, there exists a high concentration of charge carriers in regions 6 and 7. This includes a high concentration of electrons and a high concentration of holes. When the voltage polarity across the diode is quickly reversed to a reverse blocking condition, the large number of electrons and holes in these regions 6 and 7 must somehow be eliminated before the diode can begin blocking current flow. Some of these charge carriers can be eliminated due to electrons and holes recombining, whereas others can be eliminated by the charge carriers flowing out of the diode die in the form of reverse recovery current $I_{rr}$. In order to reduce the peak magnitude of this reverse recovery current, the concentration of charge carriers in the regions 6 and 7 during forward bias conditions is reduced in the novel inverse diode device die 1 of FIG. 4. In the forward bias condition, a depletion region 20 exists at the boundary or boundaries between the P+ type charge carrier extraction region 9 and the N type depletion stopper region 7. This depletion region 20 is illustrated in FIG. 5. The depletion region 20 sets up an electric field 21 across the depletion region. The direction of this electric field 21 is indicated by the arrow 21. Holes that happen to be close to or at the boundary of the depletion region 20 are swept across the depletion region 20 in the direction of the arrow 21 due to this localized charge extracting electric field. Arrow 22 in FIG. 5 illustrates the path of one such representative hole 23. The extraction of holes is continuous as the diode operates in its forward conduction mode. The continuous extraction of holes by the localized charge extracting electric field 21 reduces the concentration of holes in the regions 7 and 6 of the device in the forward bias condition (as compared to the concentration of holes that otherwise would be present were the P+ type charge carrier extraction regions not present). In addition, corresponding electrons in the neighborhood of the extracted holes in the neighborhood tend to be expelled. Charge neutrality is maintained in region 7 and region 6, so electrons are expelled from the bottom of the device. Arrow 24 in FIG. 5 illustrates the path of one such representative electron 25. This flow of electrons is also continuous as the diode operates in its forward conduction mode. The flow of electrons reduces the concentration of electrons in the regions 7 and 6 of the device in the forward bias condition (as compared to the concentration of electrons that otherwise would be present were the P+ type charge carrier extraction regions not present). Due to the attendant reduction in the number of holes and electrons in the regions 7 and 6, there are fewer charge carriers to be removed from the diode when the diode is quickly switched from a forward conduction condition to a reverse voltage condition.

In the example of FIG. 1, the electrons actually pass all the way through the lightly-doped P− type silicon region 4 and reach the metal of the bottomside anode electrode 17 without recombining. The bottomside P− type silicon region 4 is a transparent anode. Operation of a transparent anode during forward conduction is explained by comparing two structures. The first structure is set forth in FIG. 6. The P++ type region is relatively thick (for example, 56 microns). In forward conduction, holes pass from the metal of the bottomside anode metal electrode 43, through the P++ type region 44, and into the N− type region 45. Electrons attempt to flow in the opposite direction. Electrons from the N− type region 45 pass into the P++ type region 44 and toward the bottomside anode metal electrode 43. They pass into the P++ type region 44, but most all the electrons recombine in the P++ type region 44 before they reach the bottomside anode metal electrode 43. Actually, the recombination rate is higher at the left side of the P++ region 44. FIG. 7 is an illustrative diagram that shows the concentration of electrons in the structure of FIG. 6. Line 53 is the electron concentration. Vertical line 46 represents the location of the PN junction between the N− type region 45 and the P++ type region 44. Vertical line 51 represents the location of the silicon to metal boundary. Note that the concentration of electrons has dropped to almost zero well before the bottomside anode metal electrode 43 is reached at a distance of 56 microns from the PN junction. Consequently the slope of the electron concentration line 53 at the PN junction is essentially zero.

Figure 8:
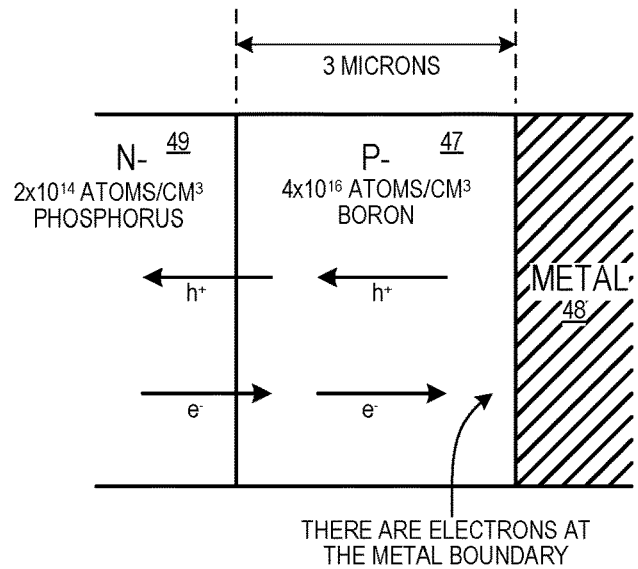
FIG. 8 is a diagram of a transparent anode structure.
Figure 9:
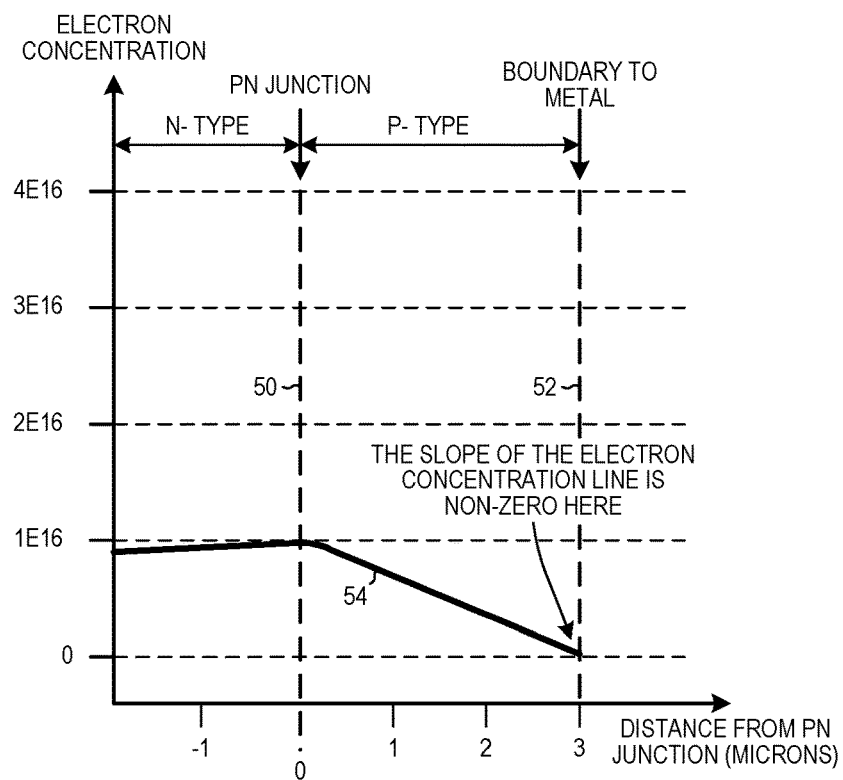
FIG. 9 is a diagram that illustrates the concentration of electrons in the structure of FIG. 8.

The second structure is set forth in FIG. 8. The P− type region 47 is lightly doped and is relatively thin (for example, 3 microns). In forward conduction, holes pass from the metal of the bottomside anode metal electrode 48, through the P− type region 47, and into the N− type region 49 as in the first structure. Holes pass in the opposite direction. Holes from the N− type region 49 pass into the P− type region 47, but due to the concentrations and the thinness of the P− type region 47, holes make it through the P− type region 47 and reach the bottomside anode metal electrode 48 without recombining with holes. FIG. 9 is an illustrative diagram that shows the concentration of electrons in the structure of FIG. 8. Vertical line 50 represents the location of the PN junction between the N− type region 49 and the P− type region 47. Vertical line 52 represents the location of the silicon to metal boundary. Line 54 is the electron concentration. Note that the concentration of electrons going from left to right through the P− type region 47 decreases as the distance from the PN junction increases, but that the electron concentration has not yet reached zero (or just reached zero) within three microns of the PN junction. Because the bottomside anode metal electrode 48 is located at a three micron distance from the PN junction, the slope of the electron concentration line 54 at the metal of the bottomside anode metal electrode 48 is non-zero. Accordingly, substantial electrons reach the metal of the bottomside anode metal electrode 48. The structure of FIG. 8 is therefore said to be a "transparent anode" because it has this behavior in forward conduction. In one example, the bottomside P− type silicon region 4 of FIG. 1 is such a transparent anode. It serves to extract electrons from the N− type region 6 of the diode device during forward conduction, thereby further reducing the charge carrier concentration in region 6 during forward conduction.

Figure 6:
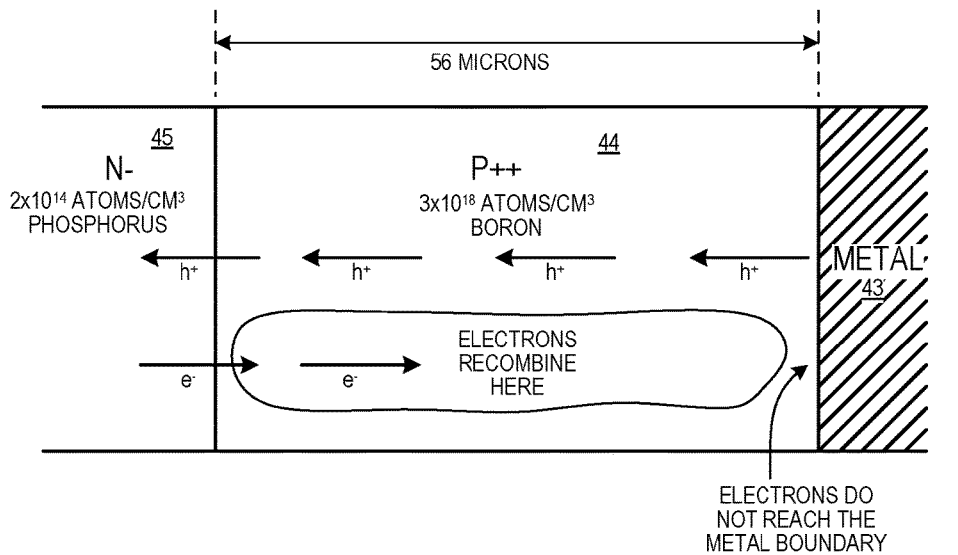
FIG. 6 is a diagram of a P++ type silicon layer that is not a transparent anode.
Figure 7:
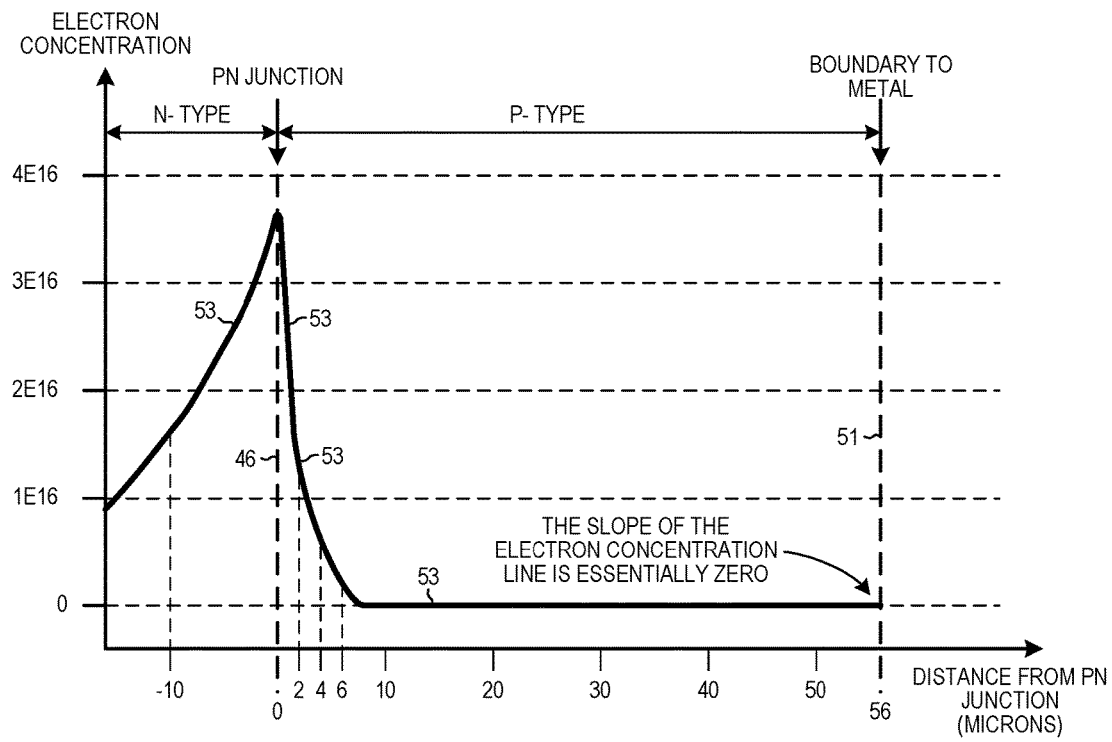
FIG. 7 is a diagram that illustrates the concentration of electrons in the structure of FIG. 6.

It is to be understood that the diagrams of FIG. 7 and FIG. 9 were prepared for instructional purposes by simulating the simplified structures of FIG. 6 and FIG. 8. Electron concentration in an actual device will have a different profile due to the more complex nature of the actual structure and due to limitations of simulation. The degree to which the bottomside P− type silicon region 4 in a real device extracts electrons during forward conduction of the diode device can be studied and optimized empirically by making a series of diode devices having different region thicknesses and dopant concentrations, and by testing the resulting devices.

Figure 10:
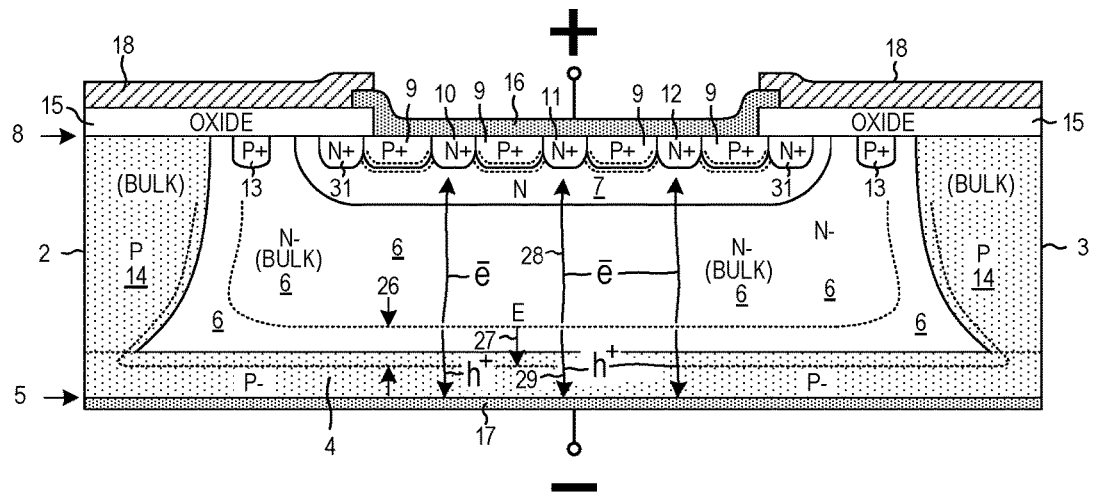
FIG. 10 is a cross-sectional diagram that illustrates an operation of the novel fast recovery inverse diode device of FIG. 1 when the diode device is switched from the forward bias condition to a reverse bias condition.
Figure 11:
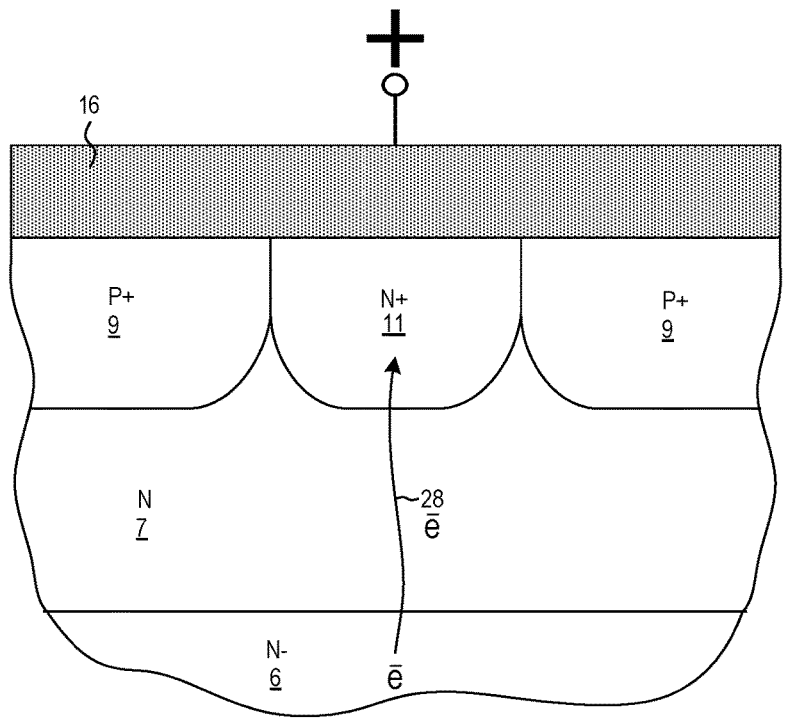
FIG. 11 shows a portion of the inverse diode device 1 of FIG. 10 in an enlarged fashion.

FIG. 10 is a cross-sectional diagram that illustrates an operation of the novel fast recovery inverse diode device 1 of FIG. 1 when the diode device is switched from the forward bias condition to a reverse bias condition. FIG. 11 shows a portion of the fast recovery inverse diode device 1 of FIG. 10 in an enlarged fashion. There is a depletion region 26 at the PN junction between the bottomside P– type silicon region 4 and the N– type silicon region 6. When the potential across the diode device is reversed, the depletion region 26 expands. It expands downward, but it expands far more upward due to the lower concentration in the N– silicon region 6. This depletion region 26 sets up an electric field 27. Holes from the expanding depletion region 26 move downward through the bottomside P– type silicon region 4 toward the anode electrode 17. Arrow 29 in FIG. 10 represents the path of one representative one of these holes. Electrons from the expanding depletion region 26 move upward through the N– type silicon region 6. Arrow 28 in FIG. 10 represents the path of one representative one of these electrons. FIG. 11 illustrates how these escaping electrons pass up through the N+ type contact regions on their way to the cathode electrode 16. Once charge carriers due to the expanding depletion region 26 have been removed from the diode device, and once excess charge carriers in regions 6 and 7 (that were present due to the high concentration of charge carriers in the forward bias condition) have been removed from the diode device, then the magnitude of the reverse recovery current $I_{rr}$ begins to decrease. The diode device then starts to operate in what is referred to here as its "static reverse blocking mode" of operation. The amount of reverse current flowing due to the reverse polarity across the diode device in a long term static condition, referred to as the reverse leakage current ($I_{lk}$), is small.

One conventional way to make a fast recovery diode is to reduce the lifetime of charge carriers present in the region of the diode where there are such charge carriers. This reduction in carrier lifetime can be accomplished by introducing so-called "recombination centers" into the silicon in the central drift region of the diode. These recombination centers are generally introduced by forming defects in the silicon through ion implantation, and/or by depositing ions or atoms into the silicon crystal lattice. Such recombination centers are generally beneficial during the short time of switching from the forward bias condition to the reverse bias condition because some electrons and holes present in the diode at that time can recombine. If these electrons and holes recombine, then they do not need to be removed from the diode in the form of reverse recovery current. Consequently, the recombination of electrons and holes due to the recombination centers serves to reduce the magnitude of the unwanted reverse recovery current. After this switching time has passed, however, and the diode begins operating in its static reverse blocking mode, these recombination centers and defects in the silicon lattice are undesirable and may cause the diode to leak. The reverse leakage current is therefore increased as compared to what the reverse leakage current would otherwise be were there to have not been added recombination centers and silicon defects. In the present novel fast recovery inverse diode device of FIG. 1, however, the diode device uses the P+ type charge carrier extraction region 9 and the transparent anode 4 to reduce charge carrier concentrations and advantageously the silicon of the N– type silicon region need not be implanted or damaged in order to create lifetime killer recombination centers. Advantageously, there are no specially added recombination centers or "lifetime killer" ions or charge carrier trapping atoms lodged in the silicon of N– type silicon region 6. The fast recovery inverse diode of FIG. 1 therefore exhibits both good reverse recovery characteristics as well as a low reverse leakage current.

Conceptually, the fast recovery inverse diode device die 1 of FIG. 1 can be envisioned as a diode-connected PNP type bipolar transistor. The emitter of the PNP bipolar transistor is the bottomside P– type silicon substrate. The collector of the PNP bipolar transistor is the topside P+ type charge carrier extraction region. The base of the PNP bipolar transistor, generally, involves the N– type silicon region, the N type depletion stopper region, and the topside N+ type contact regions. Note that the collector and the base of this PNP bipolar transistor are coupled together by the metal cathode electrode. The overall device then, in a sense, is a diode-connected PNP bipolar transistor.

Figure 13:
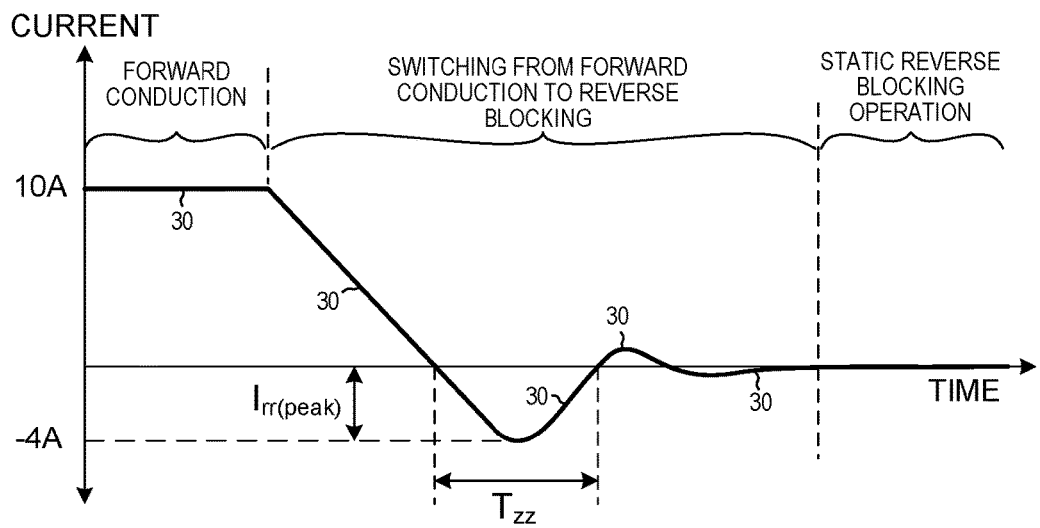
FIG. 13 is a waveform diagram that illustrates the time $T_{zz}$.

FIG. 12 is a table that sets forth results of a comparative simulation done on a "Device A" and a "Device B". This comparative simulation was carried out using the device simulator called Synopsys Sentaurus Workbench (SWB). The structures of Device A and Device B were first defined using the 2-D Sentaurus Structure Editor (SDE). The defined structures were then simulated using the device simulator (Sdevice) part of the workbench tool suite. Device A is an inverse diode device of the structure illustrated in FIG. 1, but this inverse diode device has no N type depletion stopper region 7, has no P+ type charge carrier extraction region 9, and has no transparent anode region 4. Rather, the entire region occupied by the P+ type charge carrier extraction region 9 and the N+ type contact regions are a single N+ type contact region. Device B, on the other hand, is the novel fast recovery inverse diode device 1 of FIG. 1 complete with the P– type transparent anode region 4, the N type depletion stopper region 7, and the novel P+ type charge extraction region 9. For comparison purposes, both devices were made to have the same die size (0.05 square centimeters). For comparison purposes, initial forward current flow through both devices was set to be the same at 10.0 amperes. Both devices had about the same reverse breakdown voltages $V_{br}$ of 632 volts. Heavy lifetime control was employed in Device A (to reduce carrier lifetimes) so that Device A would have a $T_{zz}$ time of about 46.9 nanoseconds when switching from the 10.0 ampere forward conduction to a 100 volt reverse voltage condition with dI/dt of 100 amperes/microsecond. The time $T_{zz}$ is defined here as the time from when the reverse recovery current $I_{rr}$ through the diode (when transitioning from a forward bias condition to a reverse bias condition) first drops to a negative current until it again rises and reaches zero current. The peak of the reverse recovery current occurs between these two zero crossing times. The $T_{zz}$ is the time interval between zero crossings of the reverse current during this reverse commutation episode. This time $T_{zz}$ is illustrated in the illustrative diode current waveform 30 of FIG. 13. For comparison purposes, the peak reverse recovery current $I_{rr}$ through both devices was made to be identical at about –3.9 amperes. In this comparative test situation, Device B exhibited far less reverse leakage than Device A, but yet Device B had a longer $T_{zz}$ of about 58.4 nanoseconds. The reverse leakage current $I_{lk}$ through Device B was about 2.04 microamperes under a static reverse voltage of 450 volts, whereas Device A was simulated to have a much larger reverse leakage current $I_{lk}$ of about 666 microamperes under the same 450 volt static reverse voltage. Accordingly, for substantially the same device area, for substantially the same forward current drop, for substantially the same reverse breakdown withstand capability, and for substantially the same peak reverse recovery current, the device of Device B has a much smaller reverse leakage current as compared to the device of Device A.

In the device of FIG. 1, there is no epitaxial silicon. Long term dynamic ruggedness of the device may be improved due to the absence of any epitaxial silicon to oxide/passivation interface in the edge termination region of the device. To make this structure, topside processing is performed on an N− type wafer. After the topside passivation step, the wafer is thinned by backside grinding. P type dopants are implanted into the bottom thinned side of the wafer, and the P type dopants are activated by laser annealing. After bottomside metallization, the wafer is diced. Accordingly, there is no epitaxial silicon in the device of FIG. 1. In another example, the fast recovery inverse diode device die of FIG. 1 does have epitaxial silicon. The starting material is a P type wafer. N− type epitaxial silicon is grown on the wafer. After topside processing and topside passivation, the wafer is thinned by backside grinding. After bottomside metallization, the wafer is diced. Accordingly, in this structure the silicon regions other than region 4 are of epitaxial silicon.

FIG. 14 is a cross-sectional side view of a second embodiment of a fast recovery inverse diode device die 33. In this structure 33, the P type isolation structure involves a deep trench type isolation structure. A deep peripheral trench 35 is made to extend from the top semiconductor surface 8 down and deep into the N− type silicon of the drift layer. This deep trench extends all the way around a central active area. This deep trench 34 is then filled with P type polysilicon 35. After the deposition of the P type polysilicon, the top surface of the wafer is planarized. After the planarization, topside processing is carried out up to the passivation step. Backside grinding is then performed to thin the wafer from the bottomside. The bottomside is then implanted with P type dopants and the dopants are activated by laser annealing. Bottomside metallization is carried out to from the bottomside anode metal electrode. The wafer is diced.

Figure 16:
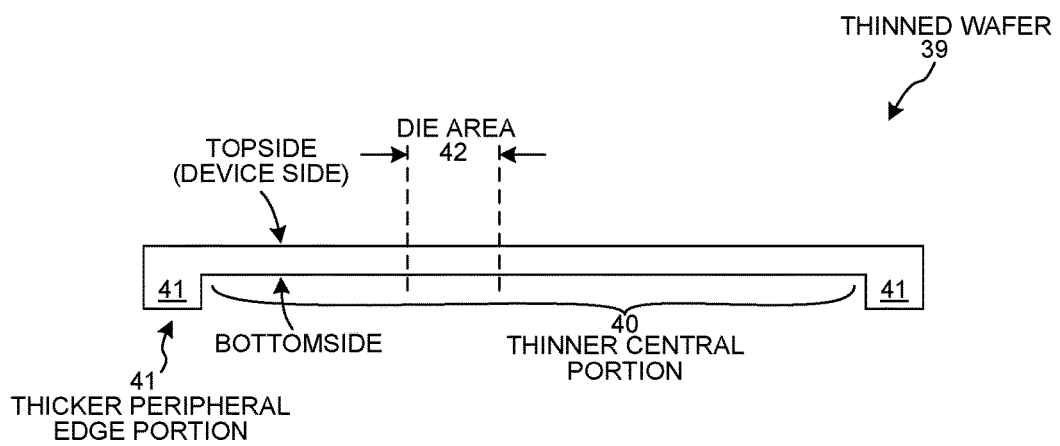
FIG. 16 is a cross-sectional side view of a thinned wafer.

In any of the above described fast recovery inverse diode device die structures, the starting material may be a wafer that after topside processing is thinned by backside grinding. The backside grinding process is often referred to as the TAIKO grinding process. See, for example, U.S. Pat. No. 8,716,067 (the entire content of which is incorporated herein by reference). After topside processing, topside oxidation, topside metallization, and topside passivation are performed to form a copy of the topside regions 14, 6, 7, 9, 10, 11, 12 and 13 in each die area, the wafer is thinned from the bottom. It is understood that the wafer is normally flipped so that its bottom side is facing up during the actual grinding step. Nonetheless, the grinding is referred to as backside grinding or backside thinning because it is the backside (i.e., not the device side) that is being ground. FIG. 16 is a cross-sectional diagram of the thinned non-crystalline silicon wafer 39. From the top-down perspective, the wafer is round. The thinned wafer 39 has a thinner central portion 40 and the thicker peripheral rim/edge portion 41. Each of these P type isolation structures separates and isolates a different die area of the wafer. Reference numeral 42 identifies one such die area. If necessary, the bottomside P− type region 4 is then formed into the bottomside of the thinned wafer. The bottomside of the wafer is then metalized. The wafer is then diced so that each individual die area becomes a separate die of the form illustrated in FIG. 1. Due to the use of the thinned wafer, the thickness of the N− type region 6 of the resulting reverse recovery diode device die can be reduced down to 28 microns. This 28 microns is measured from the top of the bottomside P− type region 4 to the bottom of the N type depletion stop region 7. For some applications in which only moderate reverse breakdown voltage withstand capability is required, the thinner N− type regions of the devices (between the bottom of region 7 and the top of region 4) allows the diode devices to have both low forward voltage $V_f$ drops (during forward conduction, at high current levels) as well as small peak reverse recovery currents $I_{rr}$. One such application is a boost-type Power Factor Correction (PFC) circuit in which the incoming AC supply voltage is either 120 VAC or 240 VAC, and in which the output voltage is a DC output voltage of 400 VDC or less. In such a case, a reverse breakdown withstand capability of 550 volts (breakdown voltage rating) is adequate, and with a ten percent margin a reverse breakdown withstand capability of 600 volts (target breakdown voltage) is selected. For such a diode device, the preferred thickness (between the top and bottom semiconductor surfaces of the TAIKO thinned wafer) is about 33 microns, with the bottomside P− type silicon region 4 being of such a thickness (for example, 3 microns) that the thickness of the N− type region 6 is 28 microns. The thickness of the N− type region 6 is more than 25 microns and less than 50 microns, and is preferably 28 microns. In this way, the advantages of the novel P+ type charge carrier extraction region is applied to the PFC circuit application. In a high temperature application, the reverse leakage current increases. In a high temperature PFC application, the diode of Device B is fast enough while still having a lower reverse leakage current than the device of Device A.

Figure 15A:
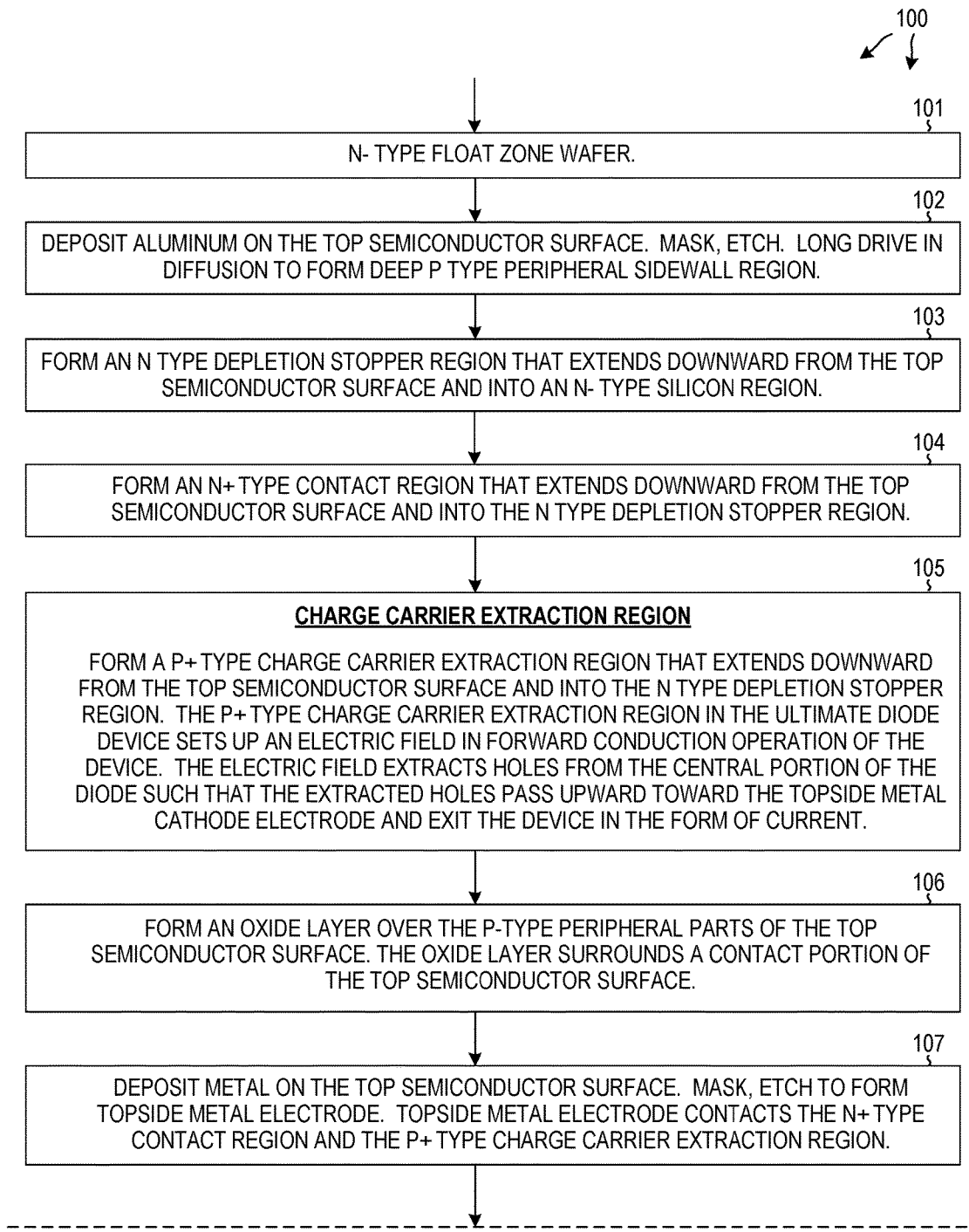
FIG. 15A is a first part of a flowchart of a novel method 100.
Figure 15B:
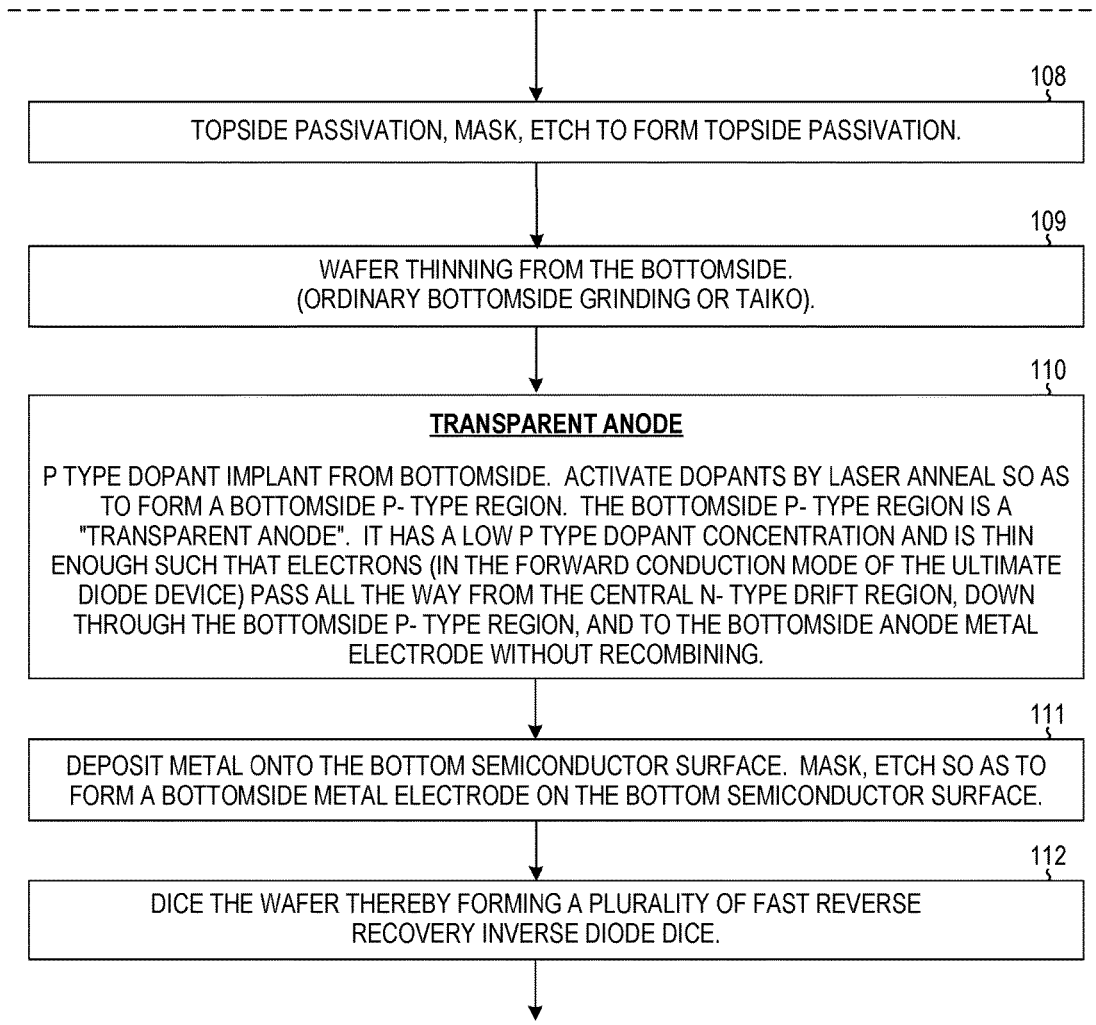
FIG. 15B is a second part of the flowchart of the novel method 100.

FIG. 15A and FIG. 15B together form a larger flowchart diagram of a method 100 in accordance with one novel aspect. The starting material is an N− type float zone silicon wafer (step 101). Aluminum is deposited (step 102) on the top semiconductor surface 8 of the wafer. The aluminum is patterned and etched so that aluminum only covers the peripheral edge parts of each die area of the wafer. The central active area of the die area is not covered with aluminum. The aluminum is driven in a high temperature diffusion step to form the P type peripheral sidewall region 14 of the die area. All the die areas of wafer are processed in the same way at the same time. The processing of only one of these die areas is detailed in the description below, but it is to be understood that all the die areas of the wafer are being simultaneously processed in the same fashion. Next, the N type depletion stopper region 7 is formed (step 103) so that it extends downward from the top semiconductor surface 8 and into N− type silicon of an N− type silicon region of the die area. Next, N+ type contact regions (for example, 10, 11, and 12) and the ring-shaped N+ type depletion stopper region 31 are formed (step 104) so that they extend downward from the top semiconductor surface 8 into the N type silicon of the N type depletion stopper region 7. Next, the P+ type charge carrier extraction region 9 and the P+ type floating ring 13 are formed (step 105) so that they extend downward from the top semiconductor surface 8. Next, a layer of oxide is formed (step 106) on the top semiconductor surface 8. This oxide layer is patterned and etched to form the oxide layer 15. Next, metal is deposited (step 107) onto the cathode contact portion of the surface 8. The metal is patterned and etched to form the topside metal electrode 16. Next, topside passivation is deposited (step 108) and patterned and etched to form passivation layer 18. At this point, topside processing of the wafer is complete. A carrier wafer may be attached to the top of the device wafer. The wafer is then thinned (step 109) from the bottomside. Ordinary backside grinding or TAIKO thinning may be employed. This backside wafer thinning forms the bottom semiconductor surface 5 of the wafer. Next, P type dopants are ion implanted from the bottom semiconductor surface 5. These P type dopants are then activated by laser annealing, thereby forming (step 110) the lightly-doped bottomside P– type region 4 (i.e., the transparent anode). The P type peripheral sidewall region and the bottomside P– type region join and merge to form a P type isolation structure. Next, metal is deposited on the bottom semiconductor surface 5, thereby forming (step 111) the bottom metal electrode 17. The wafer is then diced (step 112) so as to form a plurality of identical fast recovery inverse diode dice of identical construction. The steps of the method 100 need not be carried out in the order illustrated in the flowchart, but rather the steps can be carried in any order that results in the structure illustrated in FIG. 1.

FIG. 17 is a table that sets forth dopant concentrations, dopant types and dimensions of various parts of a novel fast recovery inverse diode device that has a reverse breakdown voltage rating of 1200 volts. With a ten percent margin, the inverse diode has a target breakdown voltage of 1320 volts.

FIG. 18 is a table that sets forth results of a comparative simulation done on a "Device C" and a "Device D". Devices C and D have reverse breakdown voltage ratings of 1200 volts. Device C is an inverse diode device of the structure of FIG. 1 and having dopant concentrations and dimensions of FIG. 17, but this inverse diode device has no N type depletion stopper region 7, has no P+ type charge carrier extraction region 9, and has no transparent anode region 4. Rather, the entire region occupied by the P+ type charge carrier extraction region 9 and the N+ type contact regions are a single N+ type contact region. Device D is the novel fast recovery inverse diode device of FIG. 1 complete with the P– type transparent anode region 4, the N type depletion stopper region 7, and the novel P+ type charge extraction region 9. Device D has dopant concentrations, and dopant types, and dimensions as set forth in FIG. 17. As compared to Device C, Device D advantageously has both a lower forward voltage $V_f$ as well as much lower reverse leakage current $I_{lk}$.

Figure 19A:
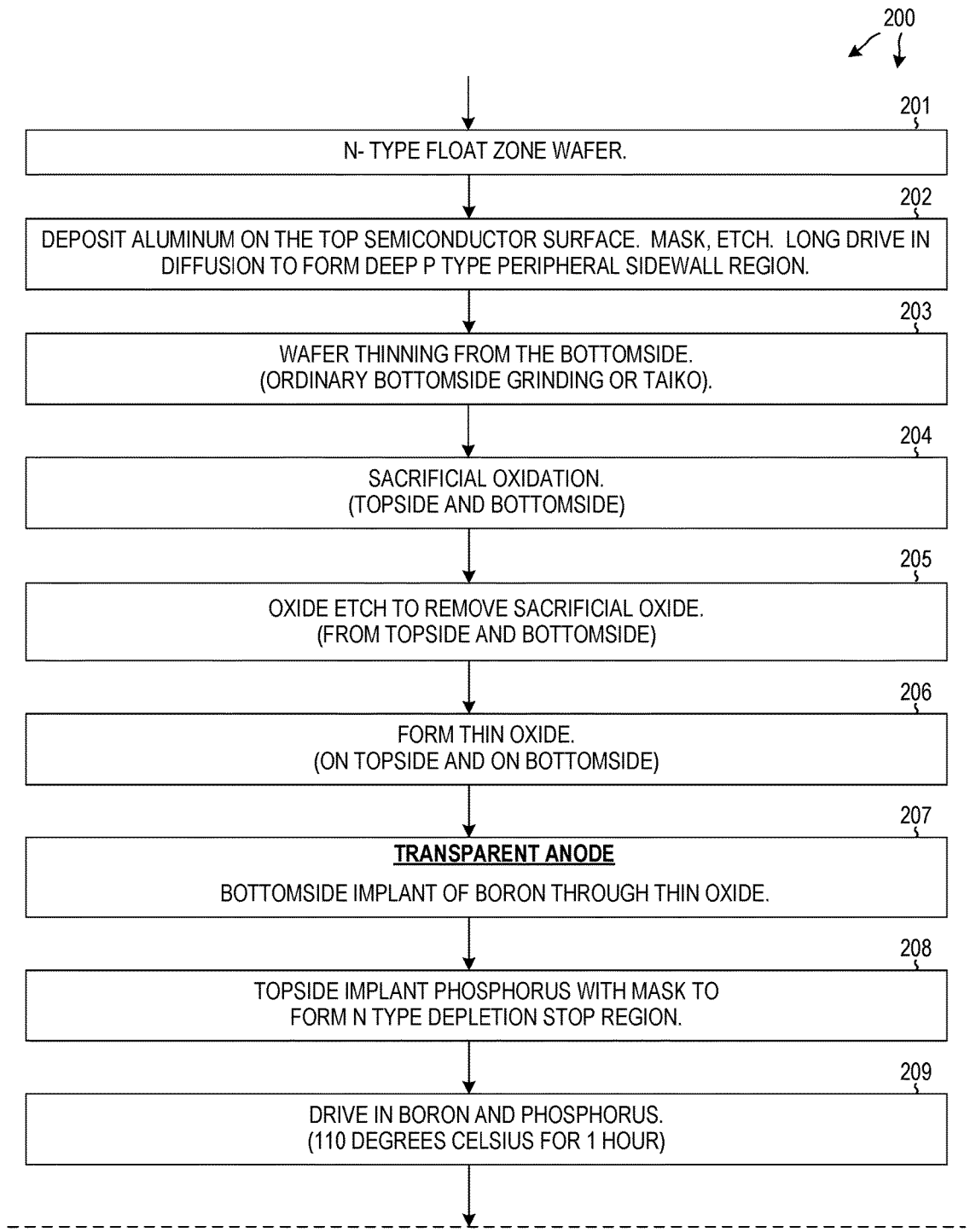
FIG. 19A is a first part of a flowchart of a novel method 200.
Figure 19B:
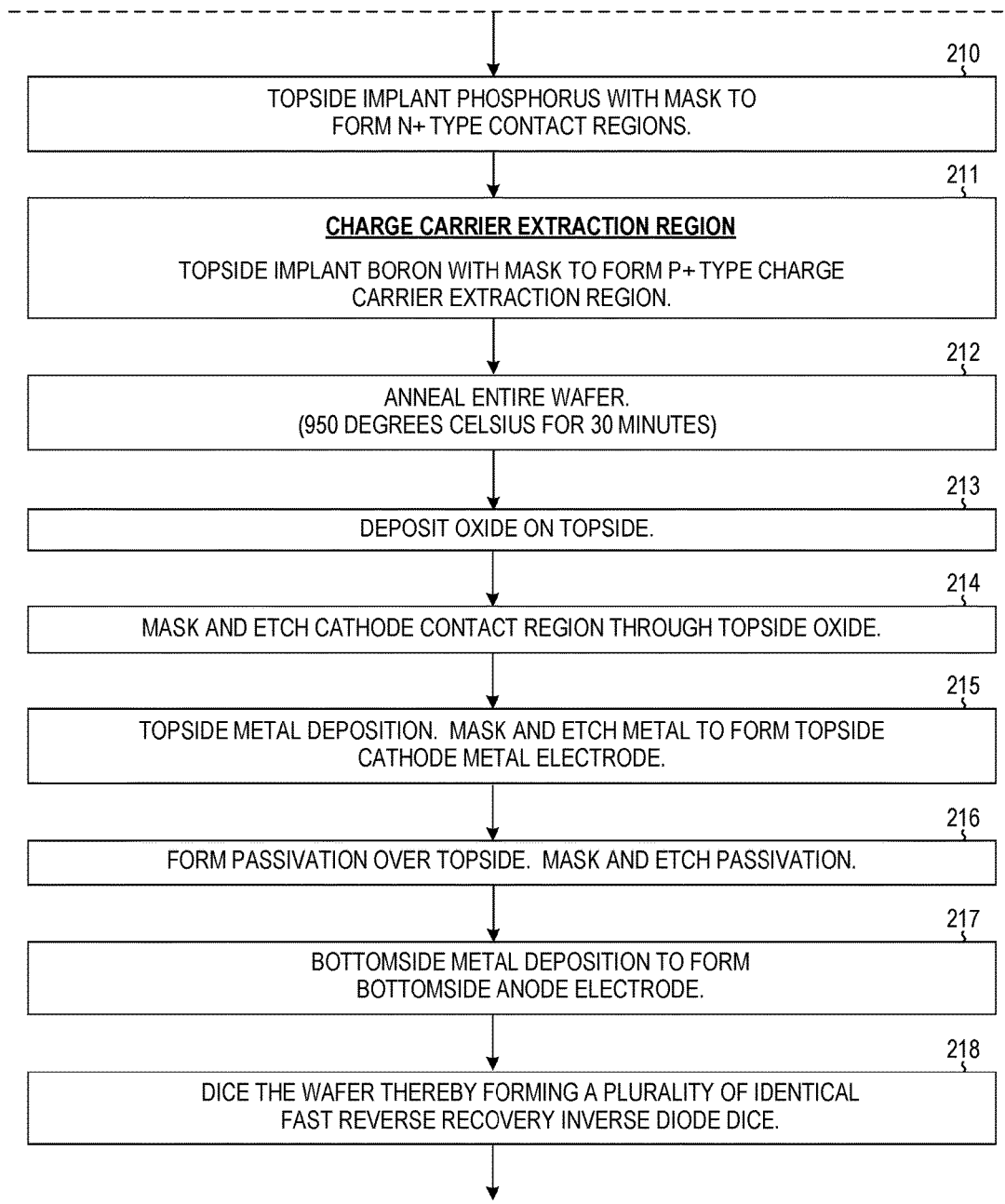
FIG. 19B is a second part of the flowchart of the novel method 200.

FIG. 19A and FIG. 19B together form a larger flowchart diagram of a method 200 in accordance with another novel aspect. Whereas in the method 100 set forth above the step of wafer thinning was performed after topside processing, in the method 200 a step of wafer thinning is performed earlier in the overall diode manufacturing process. The starting material is an N– type float zone wafer (step 201). Aluminum is deposited (step 202) on the topside, and the aluminum is masked and etched. A long drive in diffusion step is carried out to form the deep P type peripheral sidewall regions. At this early stage in the manufacturing process, the wafer is thinned (step 203) from the bottomside. This thinning can be ordinary backside grinding or TAIKO processing. A sacrificial oxide is formed (step 204) on the topside and on the bottomside. An oxide etch step is performed (step 205) to remove the sacrificial oxide from both the topside as well as the bottomside. A thin oxide is then formed (step 206) on both the topside as well as the bottomside. A bottomside implant of boron is performed through the thin oxide (step 207) into the bottomside of the wafer. The topside is implanted with phosphorus (step 208) with a mask to form the N type depletion stop regions. The boron that was implanted into the bottomside of the wafer and the phosphorus that was implanted into the topside of the wafer are then driven in (step 209). Drive in may, for example, be carried out for one hour at 110 degrees Celsius. The topside is implanted of phosphorus (step 210) with a mask to form the N+ type contact regions. Next, the topside is implanted (step 211) with boron and a mask to form the P+ type charge carrier extraction regions. The wafer is then annealed (step 212), for example at 950 degrees Celsius for 30 minutes. Oxide is formed (step 213) on the topside of the wafer, and is etched (step 214) to open up the cathode contact regions. Metal is deposited on the topside (step 215), and is masked and etched to form the topside cathode metal electrodes. A layer of passivation is deposited (step 216) on the topside, and is masked and etched to expose the topside metal cathode electrodes. Metal is deposited on the bottomside (step 217) to form the bottomside anode electrode. The wafer is then diced, thereby forming a plurality of identical fast recovery inverse diode dice. This manufacturing process advantageously involves sacrificial oxidation of the thinned bottomside silicon surface of the wafer. This sacrificial oxidation helps reduce the incidence of silicon dislocations and defects caused by the backside grinding step. Accordingly, the transparent anode that is subsequently formed into this silicon is formed into silicon that has fewer dislocations and defects. This may result in lower reverse leakage current as compared to a case in which the transparent anode is formed into silicon that has been subjected to backside grinding but has not had the sacrificial oxidation. In addition to the sacrificial oxidation, it is also possible to carry out other processing steps (for example, wet etching to remove a layer of silicon from the surface of the bottomside) that serve to reduce still further the incidence of silicon crystal defects and dislocations in the bottomside silicon due to backside grinding. A carrier wafer may be attached to and detached from the main wafer as various stages of the method 200. Such a carrier wafer may be used as is known in the art to facilitate wafer handling.

Although certain specific embodiments are described above for instructional purposes, the teachings of this patent document have general applicability and are not limited to the specific embodiments described above. Although an example of an inverse diode device die is set forth above that has an oxide layer disposed directly on the top semiconductor surface, in other embodiments there is no such oxide layer but rather the passivation layer is disposed directly on the top semiconductor surface. Although an example is illustrated involving one P+ type floating ring 13, in other examples there may be multiple P+ type guard rings as well as an additional outermost N+ type channel stopper ring. Although the thicknesses of the P+ type charge carrier extraction region and the N+ type contact regions are the same in the illustrated example, the P+ type charge carrier extraction region can be either thinner or thicker than the N+ type contact regions. The shapes of the two regions can be varied to optimize performance of the diode device for a particular application. The fast recovery inverse diode device die of FIG. 1 can be made either with or without a transparent anode. In some examples, the P type dopant concentration of bottomside region 4 is low and region 4 is relatively thin. In other examples, the P type dopant concentration of bottomside region 4 is high and region 4 is relatively thick. In examples in which the region 4 is thicker, wafer thinning may be not be carried out. Although examples are set forth above in which all silicon regions are of bulk wafer material, in other examples the bottomside P type region 4 may be wafer material whereas the other silicon regions are of epitaxial silicon. Accordingly, various modifications, adaptations, and combinations of various features of the described embodiments can be practiced without departing from the scope of the invention as set forth in the claims.

What is claimed is:

1. A semiconductor device die having a top semiconductor surface, a bottom semiconductor surface, and peripheral side edges, the die comprising:
   a bottomside P type silicon region that extends upward from the bottom semiconductor surface of the die that also extends laterally outwardly to the peripheral side edges of the die;
   an N− type silicon region disposed over the bottomside P type silicon region;
   an N type depletion stopper region that extends downward from the top semiconductor surface and into the N− type silicon region;
   a P+ type charge carrier extraction region that extends downward from the top semiconductor surface and into the N type depletion stopper region;
   an N+ type contact region that extends downward from the top semiconductor surface and into the N type depletion stopper region;
   a P type silicon peripheral sidewall region that extends downward from the top semiconductor surface into the N− type silicon region, wherein the P type silicon peripheral sidewall region joins the bottomside P type silicon region thereby forming a P type isolation structure, wherein the P type silicon peripheral sidewall region also laterally rings the N− type silicon region and separates the N− type silicon region from the peripheral side edges of the die;
   a topside metal electrode disposed on the N+ type contact region and on the P+ type charge carrier extraction region; and
   a bottomside metal electrode disposed on the bottom semiconductor surface of the die;
   a P+ type floating field ring that extends downward from the top semiconductor surface and into the N− type silicon region, wherein the P+ type floating field ring laterally rings around the N type depletion layer stopper region but is separated from the N type depletion layer stopper region by an amount of N− type silicon of the N− type silicon region.

2. The semiconductor device die of claim 1, wherein the bottomside P type silicon region is a transparent anode region, wherein the bottomside P type silicon region has a thickness of less than ten microns, and wherein the bottomside P type silicon region has a concentration of P type dopants of less than $3\times10^{17}$ atoms/cm$^3$.

3. The semiconductor device die of claim 1, wherein the N+ type contact region is one of a plurality of N+ type contact regions, wherein the plurality of N+ type contact regions are disposed in a two-dimensional array, and wherein each of the N+ type contact regions is laterally surrounded by P+ type silicon of the P+ type charge carrier extraction region.

4. The semiconductor device die of claim 1, wherein the semiconductor device die includes no N+ type contact region that is not laterally surrounded by P+ type silicon of the P+ type charge carrier extraction region, and wherein no N+ type contact region of the semiconductor device die adjoins N− type silicon of the N− type silicon region.

5. The semiconductor device die of claim 1, wherein the semiconductor device die is a discrete diode device.

6. The semiconductor device die of claim 1, wherein the semiconductor device die comprises two and no more than two metal electrodes.

7. The semiconductor device die of claim 1, wherein no part of the N type depletion stopper region makes contact with the topside metal electrode.

8. The semiconductor device die of claim 1, wherein no part of the semiconductor device die is epitaxial silicon material.

9. The semiconductor device die of claim 1, wherein the bottomside P type silicon region is of bulk wafer silicon material, and wherein the N− type silicon region is of epitaxial silicon material.

10. The semiconductor device die of claim 1, wherein some of the silicon of the peripheral side edges of the die is N type silicon.

11. The semiconductor device die of claim 1, wherein no part of the silicon of the peripheral side edges of the die is N type silicon.

12. The semiconductor device die of claim 1, wherein the P type silicon peripheral sidewall region is doped with aluminum.

13. The semiconductor device die of claim 1, further comprising:
   a ring-shaped N+ type depletion stopper ring, wherein the N+ type depletion stopper ring extends downward from the top semiconductor surface, wherein the ring-shaped N+ type deletion stopper ring rings around the P+ type charge carrier extraction region laterally, wherein the N+ type depletion stopper ring has an outer peripheral boundary that bounds the N type depletion stopper region, and wherein no part of the N+ type depletion stopper ring adjoins any N− type silicon of the N− type silicon region.

14. The semiconductor device die of claim 2, wherein the bottomside P type silicon region is a means for conducting electrons so that in the forward conduction mode of the semiconductor device die the electrons pass from the N− type silicon region, all the way through the transparent anode region, and to the bottomside metal electrode.

15. A two-electrode inverse diode die having a top semiconductor surface, a bottom semiconductor surface, and peripheral side edges, the die comprising:
   a transparent anode region of P type silicon, wherein the transparent anode region extends upward from the bottom semiconductor surface of the die, wherein the transparent anode region has a thickness of less than ten microns, wherein the transparent anode region has a concentration of P type dopants adjacent the bottom semiconductor surface, and wherein the concentration of P type dopants is less than $3\times10^{17}$ atoms/cm$^3$;
   an N− type silicon region disposed over the transparent anode region;
   a P type silicon peripheral sidewall region that extends downward from the top semiconductor surface into the N− type silicon region, wherein the P type silicon peripheral sidewall region joins the transparent anode region thereby forming a P type isolation structure, wherein the P type isolation structure laterally rings the N− type silicon region and separates the N− type silicon region from the peripheral side edges of the die, wherein the P type isolation structure also underlies the N− type silicon region and separates the N− type silicon region from the bottom semiconductor surface;
   an N type depletion stopper region that extends downward from the top semiconductor surface and into the N− type silicon region;
   an N+ type contact region that extends downward from the top semiconductor surface and into the N type depletion stopper region;
   a topside metal electrode disposed on and in contact with the N+ type contact region;

a bottomside metal electrode disposed on the bottom semiconductor surface of the die, wherein the two-electrode inverse diode die has two and only two metal electrodes; and means for setting up a localized charge extracting electric field that continuously extracts holes from the N type depletion stopper region when the die is operating in a forward conduction mode such that the extracted holes flow toward the top semiconductor surface, wherein charge due to the extracted holes leaves the die in the form of a current flowing out of the topside metal electrode.

16. The two-electrode inverse diode die of claim 15, wherein the transparent anode region is a means for conducting electrons so that in the forward conduction mode of the inverse diode die electrons pass from the N− type silicon region, all the way through the transparent anode region, and to the bottomside metal electrode.

17. A method of manufacturing an inverse diode structure, the method comprising:
(a) forming an N type depletion stopper region that extends downward from a top semiconductor surface and into an N− type silicon region;
(b) forming a P+ type charge carrier extraction region that extends downward from the top semiconductor surface so that the P+ type charge carrier extraction region extends into the N type depletion stopper region;
(c) forming an N+ type contact region that extends downward from the top semiconductor surface so that the N+ type contact region extends into the N type depletion stopper region;
(d) forming a topside metal electrode of the inverse diode structure, wherein the topside metal electrode is disposed on the N+ type contact region and on the P+ type charge carrier extraction region;
(e) forming a bottomside P type silicon region such that the N− type silicon region is disposed over and adjoins the bottomside P type silicon region and such that the bottomside P type silicon region extends upward from a bottom semiconductor surface, wherein the bottomside P type silicon region is a part of a P type isolation structure that separates a central area of a die area of the inverse diode structure from a peripheral part of the die area; and
(f) forming a bottomside metal electrode of the inverse diode structure, wherein the bottomside metal electrode is disposed on the bottom semiconductor surface, wherein the bottomside P type silicon region of the inverse diode structure is a transparent anode region, wherein the bottomside P type silicon region has a thickness of less than ten microns, and wherein the bottomside P type silicon region has a concentration of P type dopants of less than $3 \times 10^{17}$ atoms/cm$^3$.

18. The method of claim 17, wherein the die area is a part of a wafer, the method further comprising:
(g) backside thinning the wafer after step (a) but before step (f).

19. The method of claim 17, wherein the P type isolation structure further comprises a P type silicon peripheral sidewall region, wherein the P type silicon peripheral sidewall region extends downward from the top semiconductor surface, through the N− type silicon region, and to the bottomside P type silicon region.

20. The method of claim 18, wherein wafer is backside thinned in (f) so that the wafer has a thicker peripheral edge portion and a thinner central portion.

* * * * *